United States Patent
Yeh

(10) Patent No.: US 12,405,352 B2
(45) Date of Patent: Sep. 2, 2025

(54) SIGNAL GENERATION CIRCUIT, RADAR APPARATUS, AND SIGNAL CONTROL METHOD

(71) Applicant: RichWave Technology Corp., Taipei (TW)

(72) Inventor: Chiang-Hua Yeh, Taipei (TW)

(73) Assignee: RichWave Technology Corp., Taipei (TW)

( * ) Notice: Subject to any disclaimer, the term of this patent is extended or adjusted under 35 U.S.C. 154(b) by 381 days.

(21) Appl. No.: 18/088,780

(22) Filed: Dec. 27, 2022

(65) Prior Publication Data
US 2024/0183938 A1 Jun. 6, 2024

(30) Foreign Application Priority Data
Dec. 1, 2022 (TW) .................................. 111146073

(51) Int. Cl.
*G01S 7/282* (2006.01)
*H03D 7/14* (2006.01)

(52) U.S. Cl.
CPC ............ *G01S 7/282* (2013.01); *H03D 7/1458* (2013.01)

(58) Field of Classification Search
CPC ........ G01S 7/282; G01S 13/10; G01S 13/343; G01S 7/35; G01S 13/0209; G01S 7/40;
(Continued)

(56) References Cited

U.S. PATENT DOCUMENTS 8,149,879 B2 * 4/2012 Rogerson ............ H04L 25/4902
370/347
10,965,251 B1 * 3/2021 Yeh .......................... H03M 1/66
(Continued)

FOREIGN PATENT DOCUMENTS

JP H05259769 10/1993
JP 2002164788 6/2002
(Continued)

OTHER PUBLICATIONS

"Office Action of Taiwan Counterpart Application", issued on Dec. 29, 2023, p. 1-p. 4.
(Continued)

*Primary Examiner* — Vladimir Magloire
*Assistant Examiner* — Naomi M Wolford
(74) *Attorney, Agent, or Firm* — JCIPRNET

(57) ABSTRACT

A signal generation circuit, a radar apparatus, and a signal control method are provided. The signal generation circuit includes a digital-to-analog converter (DAC) and a mixer. The DAC is configured to convert an input digital signal into two signals in a first mode. A coding content of the input digital signal includes multiple bits. The mixer is coupled to the DAC to respectively input the two signals converted from the input digital signal to two input ports of the mixer in the first mode, to generate an output signal. An output power of the output signal corresponding to the input digital signal having a first coding content is different from an output power of the output signal corresponding to the input digital signal having a second coding content. An intensity of the output signal is related to a voltage difference between the two signals converted from the input digital signal.

20 Claims, 7 Drawing Sheets

(58) Field of Classification Search
CPC ........ G01S 13/88; H03D 7/1458; H03D 7/00; H04B 1/71632; H03M 1/66
See application file for complete search history.

(56) References Cited

U.S. PATENT DOCUMENTS

| | | | |
|---|---|---|---|
| 2004/0227577 A1* | 11/2004 | Noh | H03F 1/0261 330/285 |
| 2012/0262330 A1 | 10/2012 | Park et al. | |
| 2021/0033691 A1 | 2/2021 | Solodky et al. | |
| 2022/0155412 A1 | 5/2022 | Bauduin et al. | |

FOREIGN PATENT DOCUMENTS

| | | |
|---|---|---|
| JP | 2014168159 | 9/2014 |
| JP | 2020529594 | 10/2020 |
| WO | 2012037680 | 3/2012 |
| WO | 2021214135 | 10/2021 |

OTHER PUBLICATIONS

"Office Action of Japan Counterpart Application", issued on Nov. 5, 2024, p. 1-p. 2.

\* cited by examiner

SIGNAL GENERATION CIRCUIT, RADAR APPARATUS, AND SIGNAL CONTROL METHOD

CROSS-REFERENCE TO RELATED APPLICATION

This application claims the priority benefit of Taiwan application serial no. 111146073, filed on Dec. 1, 2022. The entirety of the above-mentioned patent application is hereby incorporated by reference herein and made a part of this specification.

BACKGROUND

Technical Field

The disclosure relates to a signal processing technology, and particularly relates to a signal generation circuit, a radar apparatus, and a signal control method.

Description of Related Art

Radar and communication systems used for ultra-wideband (UWB) may have requirements for ultra-low power control. Among the radar systems for UWB, frequency modulation continuous waveform (FMCW) and impulse radio radar systems are more likely to face the following challenges: the need to weaken (roll-off) the spikes of a chirp signal on the frequency spectrum and the need to use a coding scheme to carry digital information.

SUMMARY

A signal generation circuit according to an embodiment of the disclosure includes, but not limited to, a digital-to-analog converter (DAC) and a mixer. The digital-to-analog converter is configured to convert an input digital signal into two signals in a first mode. A coding content of the input digital signal includes a plurality of bits. The mixer is coupled to the digital-to-analog converter and configured to respectively input the two signals converted from the input digital signal to two input ports of the mixer in the first mode so as to generate an output signal. An output power of the output signal corresponding to the input digital signal having a first coding content is different from an output power of the output signal corresponding to the input digital signal having a second coding content, and an intensity of the output signal is related to a voltage difference between the two signals converted from the input digital signal.

A radar apparatus according to an embodiment of the disclosure includes, but not limited to, the above-mentioned signal generation circuit and a transmitting circuit. The transmitting circuit is coupled to the signal generation circuit. The transmitting circuit is configured to generate a transmission signal according to the output signal. The transmission signal is transmitted out by the radar apparatus.

A signal control method according to an embodiment of the disclosure includes, but not limited to, the following: converting an input digital signal into two signals in a first mode, in which a coding content of the input digital signal includes a plurality of bits; and generating an output signal according to the two signals converted from the input digital signal through a mixer in the first mode. An output power of the output signal corresponding to the input digital signal having a first coding content is different from an output power of the output signal corresponding to the input digital signal having a second coding content, and an intensity of the output signal is related to a voltage difference between the two signals converted from the input digital signal.

In order to make the above-mentioned and other features and advantages of the disclosure more comprehensible, exemplary embodiments will be described in detail hereinafter with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
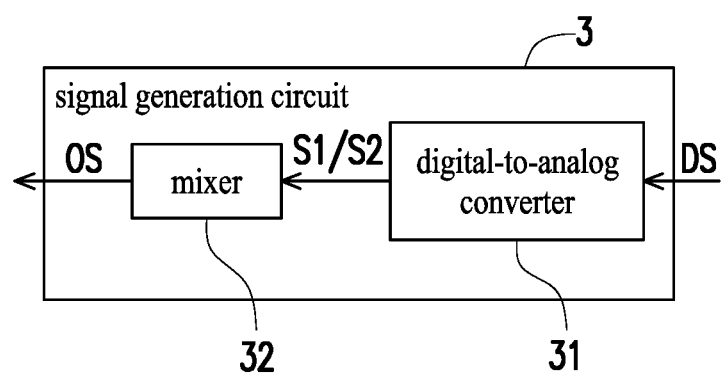
FIG. 1 is a block diagram of components of a signal generation circuit according to an embodiment of the disclosure.

FIG. 1 is a block diagram of components of a signal generation circuit 3 according to an embodiment of the disclosure. The signal generation circuit 3 includes (but not limited to) a digital-to-analog converter (DAC) 31 and a mixer 32. The digital-to-analog converter 31 is coupled to the mixer 32. The digital-to-analog converter 31 is configured to convert an input digital signal DS in digital form into signals in analog form (for example, signals S1 and S2). The digital-to-analog converter 31 may be implemented by an N-stage (N is the number of bits of the input digital signal DS, and is a positive integer greater than zero) oversampling modulator or an N-bit Nyquist frequency sampler.

The architecture of the signal generation circuit 3 is applicable to a radar or communication system, especially to a radar or communication system for ultra-wideband (UWB). Hereinafter, FIG. 2A and FIG. 2B illustrate a radar apparatus 10 and a radar apparatus 20 as exemplary embodiments to show how the signal generation circuit 3 (implemented as a signal generation circuit 13) operates.

Figure 2A:
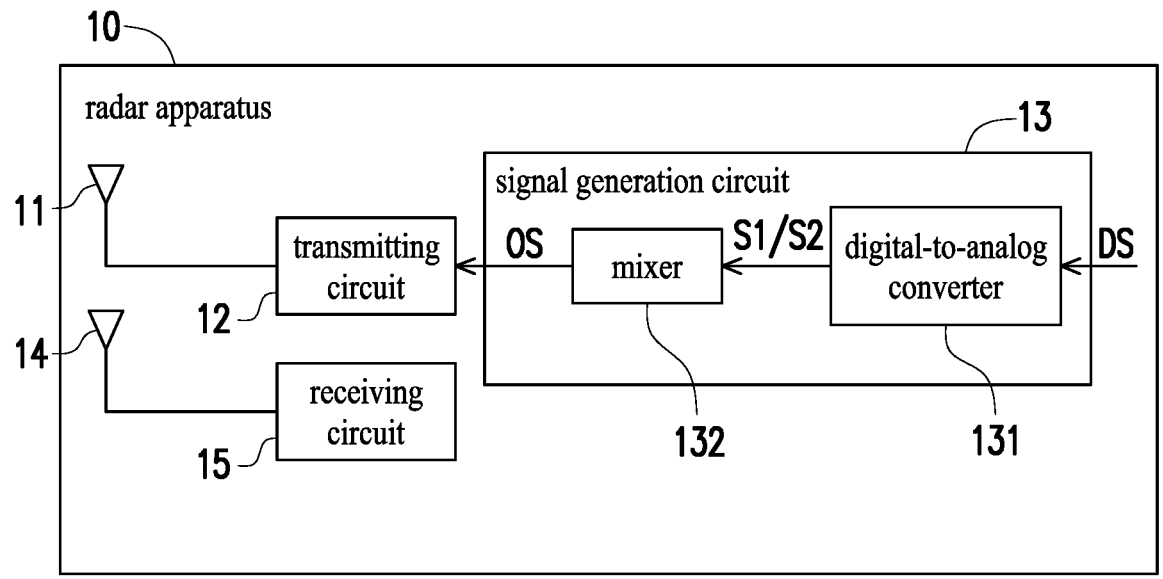
FIG. 2A is a block diagram of components of a radar apparatus according to an embodiment of the disclosure.
Figure 2B:
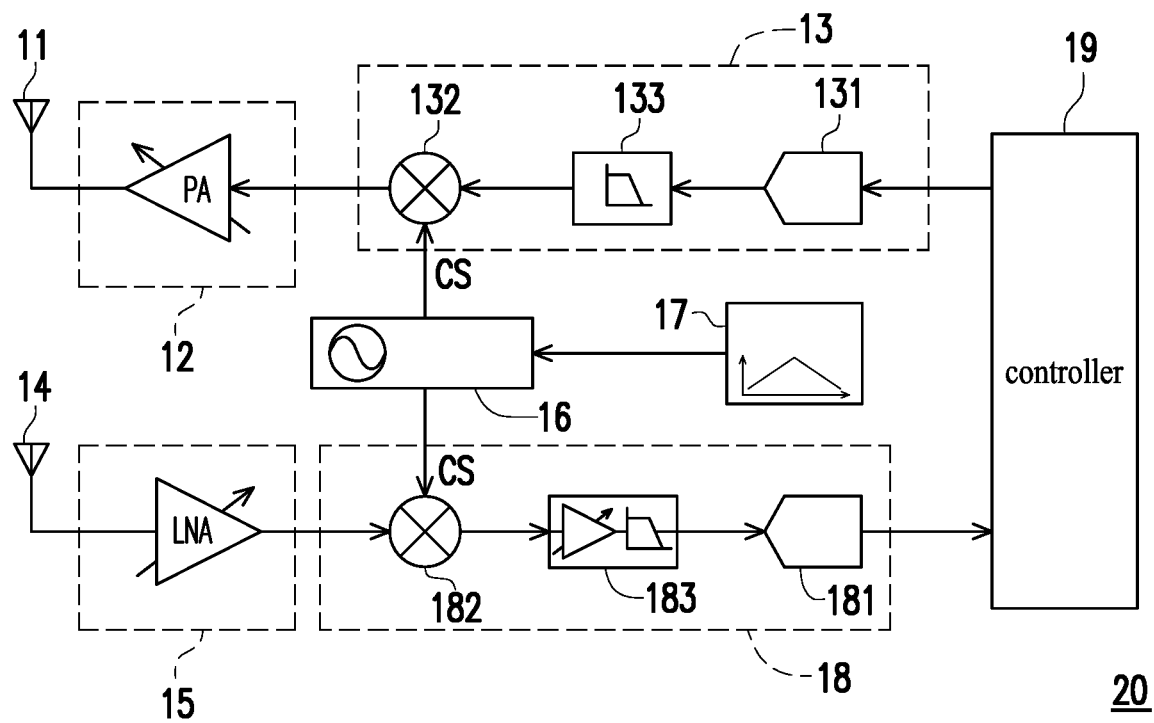
FIG. 2B is a block diagram of components of a radar apparatus according to an embodiment of the disclosure.

FIG. 2A is a block diagram of components of the radar apparatus 10 according to an embodiment of the disclosure. Referring to FIG. 2A, the radar apparatus 10 includes (but not limited to) a transmitting antenna 11, a transmitting circuit 12, a signal generation circuit 13, a receiving antenna 14, and a receiving circuit 15. The signal generation circuit 13 in FIG. 2A is an implementation of the signal generation circuit 3 in FIG. 1 applied to a radar apparatus. The radar apparatus 10 is applicable to fields such as meteorology, speed measurement, reversing, topography, and military affairs, for example. The radar apparatus 10 may be a frequency modulated continuous wave (FMCW) radar or an impulse radio (IR)-ultra-wideband (UWB) radar.

The transmitting circuit 12 is coupled to the transmitting antenna 11. In an embodiment, the transmitting circuit 12 is configured to transmit signals through the transmitting antenna 11.

The signal generation circuit 13 is coupled to the transmitting circuit 12. The signal generation circuit 13 includes (but not limited to) a digital-to-analog converter (DAC) 131 and a mixer 132.

The digital-to-analog converter 131 is coupled to the mixer 132. The digital-to-analog converter 131 is configured to convert the input digital signal DS in digital form into signals in analog form (for example, signals S1 and S2). The digital-to-analog converter 131 may be implemented by an N-stage (N is the number of bits of the input digital signal DS, and is a positive integer greater than zero) oversampling modulator or an N-bit Nyquist frequency sampler.

The mixer 132 is coupled to the transmitting circuit 12. The mixer 132 is configured to process the output signals (for example, signals S1 and S2) of the digital-to-analog converter 131 and generate an output signal OS. The transmitting circuit 12 may generate a transmission signal according to the output signal OS to be transmitted from the transmitting antenna 11 of the radar apparatus 10.

The receiving circuit 15 is coupled to the receiving antenna 14. The receiving circuit 15 is configured to receive an echo signal through the receiving antenna 14. The echo signal is generated when the transmission signal transmitted by the transmitting antenna 11 is reflected by an external object, but not limited thereto.

The detailed hardware architecture of the radar apparatus 10 will be described hereinafter with reference to FIG. 2B.

FIG. 2B is a block diagram of components of the radar apparatus 20 according to an embodiment of the disclosure. Referring to FIG. 2B, the radar apparatus 20 is a specific implementation of the radar apparatus 10. The radar apparatus 20 includes (but not limited to) a transmitting antenna 11, a transmitting circuit 12, a signal generation circuit 13, a receiving antenna 14, a receiving circuit 15, a frequency synthesizer 16, a modulator 17, an intermediate frequency processing circuit 18, and a controller 19.

The transmitting circuit 12 includes a power amplifier PA. The power amplifier PA amplifies the output signal OS to generate a transmission signal, and transmits the transmission signal outside through the transmitting antenna 11 (that is, the transmitted electromagnetic wave carries the output signal OS of the radar apparatus 20).

The signal generation circuit 13 may further include a filter 133. The filter 133 performs low-pass filtering on the analog signal output from the digital-to-analog converter 131 to form the signals (for example, signals S1 and S2) input to the mixer 132. However, in other embodiments, the signal generation circuit 13 may not include the filter 133.

The receiving circuit 15 includes a low noise amplifier LNA. The low noise amplifier LNA amplifies the signal received by the receiving antenna 14 to generate a received radio frequency signal.

The frequency synthesizer 16 is coupled to the mixer 132 and a mixer 182 of the intermediate frequency processing circuit 18. The frequency synthesizer 16 inputs the carrier signal CS to the mixer 132 and/or the mixer 182. In an embodiment, the carrier signal CS may be a sawtooth wave or a triangular wave, or the carrier signal CS may be other carrier signals (such as linear, geometric or other chirp signals) applied to FMCW, for example, a frequency sweep signal for FMCW radar, and the frequency thereof varies with time during the frequency sweep period. In another embodiment, the carrier signal CS may be a fixed frequency continuous wave or a fixed frequency signal, for example, a fixed frequency carrier signal CS for IR-UWB radar.

The modulator 17 is coupled to the frequency synthesizer 16. The modulator 17 may be a sigma-delta modulator (SDM). The modulator 17 is configured to adjust the step of changing the frequency of the carrier signal CS as the frequency sweep signal.

The intermediate frequency processing circuit 18 may include an analog-to-digital converter (ADC) 181, the mixer 182, and an adjustment circuit 183.

The mixer 182 is coupled to the receiving circuit 15, the frequency synthesizer 16, and the adjusting circuit 183. The mixer 182 is configured to process the output signal of the receiving circuit 15 (for example, the aforementioned received radio frequency signal) and the carrier signal CS, and generate an intermediate frequency signal.

The adjustment circuit 183 may include an amplifier and/or a filter, and is configured to amplify and/or perform low-pass filtering on the intermediate frequency signal.

The analog-to-digital converter 181 is configured to convert the intermediate frequency signal in analog form into a digital signal.

The controller 19 is coupled to the digital-to-analog converter 131 and the analog-to-digital converter 181. The controller 19 may be a chip, a processor, a microcontroller, an application-specific integrated circuit (ASIC), or any type of digital circuit. In an embodiment, the controller 19 is configured to determine the coding content of the input digital signal DS, and the content thereof will be described in detail in the subsequent embodiments. In an embodiment, the controller 19 is configured to determine the mode, and the mode will be described in detail in the subsequent embodiments. In an embodiment, the controller 19 is configured to determine position information of the external object according to the output signal of the intermediate frequency processing circuit 18.

In other embodiments, the signal generation circuit 13 may be installed in other radio frequency devices.

In the following, the operation of the radar apparatuses 10 and 20 will be described together with various components.

In an embodiment, the digital-to-analog converter 131 is configured to convert the input digital signal DS into the signal S1 and the signal S2 in a first mode. The first mode may be a power control mode or other modes related to power adjustment, and is used to adjust the output power of the signal generation circuit 13.

In an embodiment, the input digital signal DS is a coded digital signal, and the digital-to-analog converter 131 outputs both the signal S1 and the signal S2 according to the coding content of the input digital signal DS. The coding content of the input digital signal DS includes multiple bits.

In an embodiment, the number of bits of the coding content of the input digital signal DS is two. For example, Table (1) is a comparison table illustrating the coding content (2 bits) of the input digital signal DS and the output voltages of the signal S1 and the signal S2:

TABLE 1

| Coding content [1:0] | Output voltage of signal S1 (volt) | Output voltage of signal S2 (volt) | Output voltage OS (volt) |
|---|---|---|---|
| 00 | 0 | 1.2 | $+V_{fLO\_max}$ |
| 01 | 0.3 | 0.9 | $+V_{fLO}$ |
| 10 | 0.6 | 0.6 | non-interleaved (NIL) |
| 11 | 0.9 | 0.3 | $-V_{fLO}$ |

If the coding content is "00", the signals S1 and S2 are respectively DC signals with output voltages of 0 volt (for example, grounded) and 1.2 volts (for example, power supply voltage); if the coding content is "01", the signals S1 and S2 are respectively DC signals with output voltages of 0.3 volts and 1 volt; if the coding content is "10", the signals S1 and S2 are respectively DC signals with output voltages of 0.6 volts; and if the coding content is "11", the signals S1 and S2 are respectively DC signals with output voltages of 1 volt and 0.3 volts. The output signal OS of the signal generation circuit 13 will be described in detail in the subsequent embodiments.

In another embodiment, the number of bits of the coding content of the input digital signal DS is greater than two. For example, Table (2) is a comparison table illustrating the coding content (3 bits) of the input digital signal DS and the output voltages of the signal S1 and the signal S2:

TABLE 2

| Coding content [2:0] | Output voltage of signal S1 (volt) | Output voltage of signal S2 (volt) | Output voltage OS (volt) |
|---|---|---|---|
| 000 | 0 | 1.2 | $+4^2\Delta V_{fLO}$ |
| 001 | 0.15 | 1.05 | $+3^2\Delta V_{fLO}$ |
| 010 | 0.30 | 0.9 | $+2^2\Delta V_{fLO}$ |
| 011 | 0.45 | 0.75 | $+1^2\Delta V_{fLO}$ |
| 100 | 0.6 | 0.6 | NIL |
| 101 | 0.75 | 0.45 | $-1^2\Delta V_{fLO}$ |
| 110 | 0.9 | 0.30 | $-2^2\Delta V_{fLO}$ |
| 111 | 1.05 | 0.15 | $-3^2\Delta V_{fLO}$ |

If the coding content is "000", the signals S1 and S2 are respectively DC signals with output voltages of 0 volt and 1.2 volts; if the coding content is "001", the signals S1 and S2 are respectively DC signals with output voltages of 0.15 volts and 1.05 volts; if the coding content is "010", the signals S1 and S2 are respectively DC signals with output voltages of 0.3 volts and 0.9 volts; if the coding content is "011", the signals S1 and S2 are respectively DC signals with output voltages of 0.45 volts and 0.75 volts; if the coding content is "100", the signals S1 and S2 are respectively DC signals with output voltages of 0.6 volts; if the coding content is "101", the signals S1 and S2 are respectively DC signals with output voltages of 0.75 volts and 0.45 volts; if the coding content is "110", the signals S1 and S2 are respectively DC signals with output voltages of 0.9 volts and 0.3 volts; and if the coding content is "111", the signals S1 and S2 are respectively DC signals with output voltages of 1.05 volts and 0.15 volts. The output signal OS will be described in detail in the subsequent embodiments.

It should be noted that the coding content of the input digital signal DS may also be composed of 4, 5, 6 or other bits. In addition, there may be other changes in the corresponding relationship between the coding content and the output voltages of the signal S1 and the signal S2. The corresponding relationship may be changed depending on the requirements of the user, and the embodiment of the disclosure is not intended to limit any change.

In an embodiment, in the first mode (for example, power control mode or other modes related to power adjustment), the mixer 132 respectively inputs the signal S1 and the signal S2 to two input ports of the mixer 132 to generate the output signal OS. That is, the mixer 132 processes the signal S1 and the signal S2 respectively input through the two input ports, and generates the output signal OS.

Figure 3:
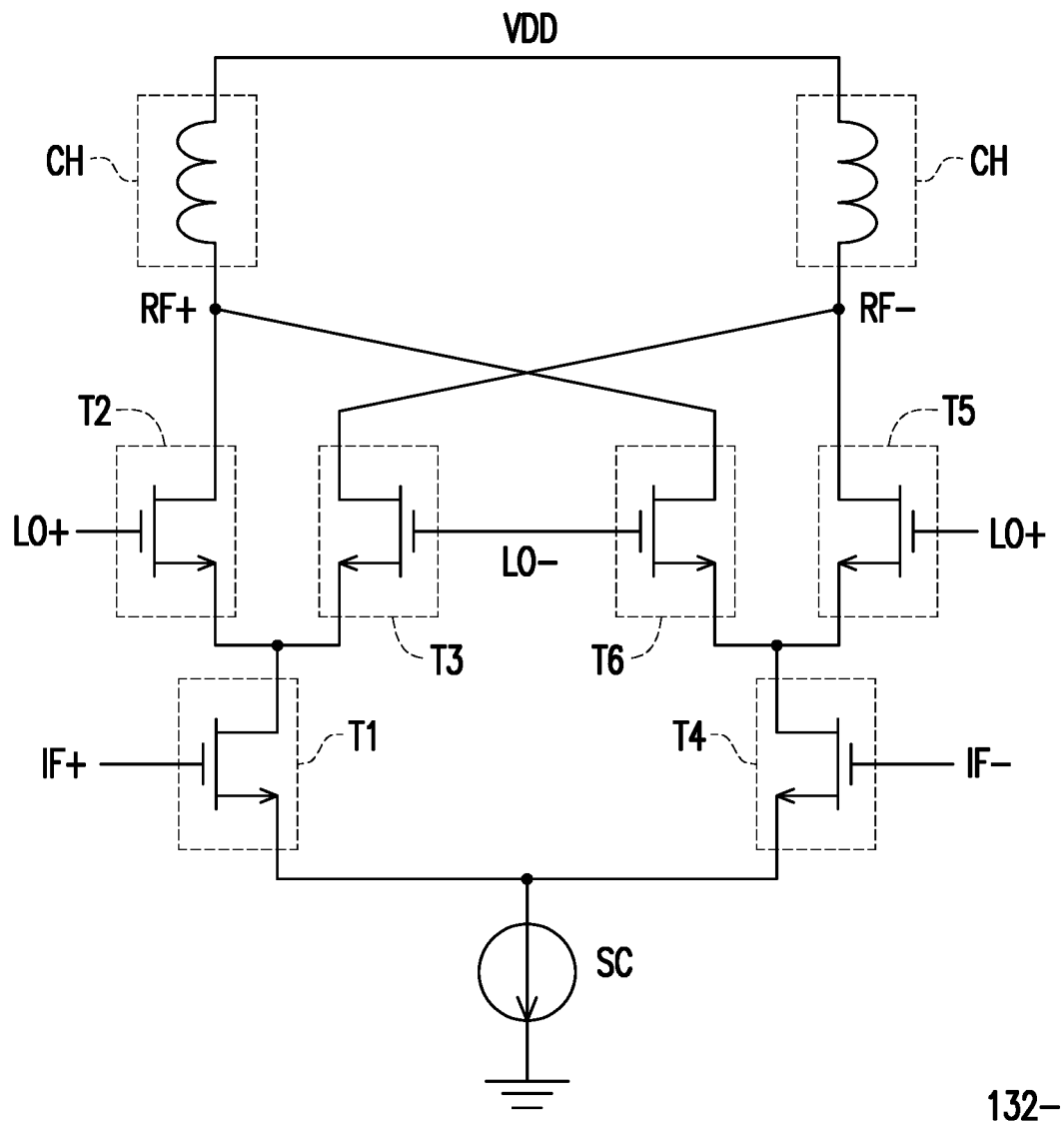
FIG. 3 is a circuit diagram of a mixer according to an embodiment of the disclosure.

FIG. 3 is a circuit diagram of a mixer 132-1 according to an embodiment of the disclosure. Referring to FIG. 3, the mixer 132-1 is a specific implementation of the mixer 132 or the mixer 182. The mixer 132-1 is a double-balanced mixer (for example, a Gilbert cell).

The mixer 132-1 includes transistors T1, T2, T3, T4, T5, and T6. The control port (for example, the gate) of the transistor T1 is coupled to the output port of the digital-to-analog converter 131, and serves as one of the two input ports of the mixer 132-1 to receive the control signal IF+ (for example, one of the signal S1 and the signal S2). The control port (for example, the gate) of the transistor T4 is coupled to the output port of the digital-to-analog converter 131, and serves as the other one of the two input ports of the mixer 132-1 to receive the control signal IF− (For example, the other one of the signal S1 and the signal S2).

In an embodiment, in the first mode, the two input ports of the mixer 132-1 are differential input ports. Taking the control signal IF+ as the signal S1 and the control signal IF− as the signal S2 as an example, the signal S1 and the signal S2 form a set of differential signals, and the output voltages of the signal S1 and the signal S2 form a set of differential voltages.

In another embodiment, in the second mode, the control signals IF+ and IF− are intermediate frequency signals. For example, the signal S1 and the signal S2 are sine wave signals in AC form. The second mode may be a mixing mode or other modes for generating new frequencies according to multiple input signals.

The first port (for example, the source) of the transistor T1 is coupled to the current source SC (the other port of which is used to couple to a reference voltage port, for example, ground), and the second port (for example, the drain) of the transistor T1 is used as the output port of the transistor T1. The transistor T1 is controlled by the control signal IF+ to change the conduction state thereof. For example, the transistor T1 may be turned on or off, so that the control signal IF+ is output or cut off.

For example, when the control signal IF+ is a DC high voltage level, the transistor T1 is turned on, so that the transistor T1 outputs the control signal IF+ to the transistor T2. For another example, the control signal IF+ in AC form is input to the transistor T1 to dynamically control the conduction state of the transistor T1, such as being turned on or off. For another example, when the control signal IF+ is a DC low voltage level (that is, the potential of the reference voltage, such as the ground potential), the transistor T1 is turned off, so that the transistor T1 has no output.

The control port (for example, the gate) of the transistor T2 is configured to receive the input signal LO+, the first port (for example, the source) of the transistor T2 is coupled to the output port of the transistor T1, and the second port (for example, the drain, which serves as one of the other two input ports of the mixer 132-1) of the transistor T2 serves as the output port of the transistor T2. The input signal LO+ may be a clock signal or a local oscillator signal. The transistor T2 is controlled by the input signal LO+ to change the conduction state thereof. For example, the transistor T2 may be turned on or off, so that the control signal IF+ is passed or cut off. The transistor T2 may process the control signal IF+ output by the transistor T1 and the input signal LO+ to form the output signal RF+.

The control port (for example, the gate) of the transistor T3 is configured to receive the input signal LO−, the first port (for example, the source) of the transistor T3 is coupled to the output port of the transistor T1, and the second port (for example, the drain) of the transistor T3 serves as the output port of the transistor T3 (optionally coupled to the choke coil CH for receiving the power supply voltage VDD). The input signal LO− may be a clock signal or a local oscillator signal. The transistor T3 is controlled by the input signal LO− to change the conduction state thereof. For example, the transistor T3 may be turned on or off, so that the control signal IF+ is passed or cut off. The transistor T3 may process the control signal IF+ output by the transistor T1 and the input signal LO− to form the output signal RF− different from the output signal RF+.

Furthermore, the first port (for example, the source) of the transistor T4 is coupled to the current source SC, and the second port (for example, the drain) of the transistor T4 serves as the output port of the transistor T4. The transistor T4 is controlled by the control signal IF− to change the conduction state thereof. For example, the transistor T4 may be turned on or off, so that the control signal IF− is output or cut off.

For example, when the control signal IF− is a DC high voltage level, the transistor T4 is turned on, so that the transistor T4 outputs the control signal IF− to the transistor T5. For another example, the control signal IF− in AC form is input to the transistor T4 to dynamically control the conduction state of the transistor T4, such as being turned on or off. For another example, when the control signal IF− is a DC low voltage level (that is, the potential of the reference voltage, such as the ground potential), the transistor T4 is turned off, so that the transistor T4 has no output.

The control port (for example, the gate) of the transistor T5 is configured to receive the input signal LO+, the first port (for example, the source) of the transistor T5 is coupled to the output port of the transistor T4, and the second port (for example, the drain) of the transistor T5 serves as the output port of the transistor T5. The transistor T5 is controlled by the input signal LO+ to change the conduction state thereof. For example, the transistor T5 may be turned on or off, so that the control signal IF− is passed or cut off. The transistor T5 may process the control signal IF− output by the transistor T4 and the input signal LO+ to form the output signal RF−.

The control port (for example, the gate, which serves as the other one of the other two input ports of the mixer 132-1) of the transistor T6 is configured to receive the input signal LO−, the first port (for example, the source) of the transistor T6 is coupled to the output port of the transistor T4, and the second port (for example, the drain) of the transistor T6 serves as the output port of the transistor T6 (optionally coupled to the choke coil CH). The transistor T6 is controlled by the input signal LO− to change the conduction state thereof. For example, the transistor T6 may be turned on or off, so that the control signal IF− is passed or cut off. The transistor T6 may process the control signal IF− output by the transistor T4 and the input signal LO− to form the output signal RF+ different from the output signal RF−.

In an embodiment, in the first mode, the signal S1 and the signal S2 are DC signals. At this time, the control signals IF+ and IF− are DC signals, and the mixer 132-1 is used as a buffer, an attenuator or a power supply. The output power of the output signal OS corresponding to the input digital signal DS having the first coding content is different from the output power of the output signal OS corresponding to the input digital signal DS having the second coding content. The output signal OS includes the aforementioned output signal RF+ and output signal RF−. That is to say, the input digital signal DS having different coding contents can generate the output signal OS with different output powers. In addition, the intensity of the output signal OS is related to the voltage difference between the signal S1 and the signal S2. That is, by changing the voltage difference between the signal S1 and the signal S2, the output signal OS with different intensities/output powers can be generated.

Taking Table (1) as an example, if the coding content is "00", the output signal OS is $+V_{fLO\_max}$ volts ($V_{fLO\_max}$ is the maximum voltage); if the coding content is "01", the output signal OS is $+V_{fLO}$ volts ($V_{fLO}$ is a voltage between 0 and $V_{fLO\_max}$); if the coding content is "10", the output signal OS is 0 volt; and if the coding content is "11", the output signal OS is $-V_{fLO}$ volts. $V_{fLO}=V_{DC}*COS(2\pi f_{LO}t+\varphi)$, where $V_{DC}$ is the output voltage of the signal S1 or S2, $f_{LO}$ is the frequency of the carrier signal CS (for example, a sine wave signal or a clock signal), and $\varphi$ is a phase constant.

The polarity of the output signal OS is related to the polarity of the voltage difference between the signal S1 and the signal S2. For example, if the voltage difference between the signal S1 and the signal S2 is positive, the output signal OS is positive; and if the voltage difference between the signal S1 and the signal S2 is negative, the output signal OS is negative. That is, assuming that the voltage difference is the signal S1 minus the signal S2, if the signal S1 is greater than the signal S2, the output signal OS is positive; and if the signal S1 is less than the signal S2, the output signal OS is negative. In addition, if the signal S1 is equal to the signal S2, the output signal OS is zero. That is, the mixer 132/132-1 has no output.

In an embodiment, the number of bits (that is, the total number of bits) of the coding content of the input digital signal DS is greater than 2, and the output signal OS has more than 4 different voltages. Taking Table (2) as an example, the number of bits is 3. The coding contents are "000", "001", "010", "011", "100", "101", "110", and "111", the output signals OS are $+4^2\Delta V_{fLO}$, $+3^2\Delta V_{fLO}$, $+2^2\Delta V_{fLO}$, $+1^2\Delta V_{fLO}$, 0 (that is, NIL with no output), $-1^2\Delta V_{fLO}$, $-2^2\Delta V_{fLO}$, and $-3^2\Delta V_{fLO}$ volts. That is, there are 8 different voltages. As the absolute value of the voltage difference between the signal S1 and the signal S2 increases, the absolute value of the output signal OS also increases; and as the absolute value of the voltage difference between the signal S1 and the signal S2 decreases, the absolute value of the output signal OS also decreases, until the signal S1 is equal to the signal S2, that is, no output.

Figure 4A:
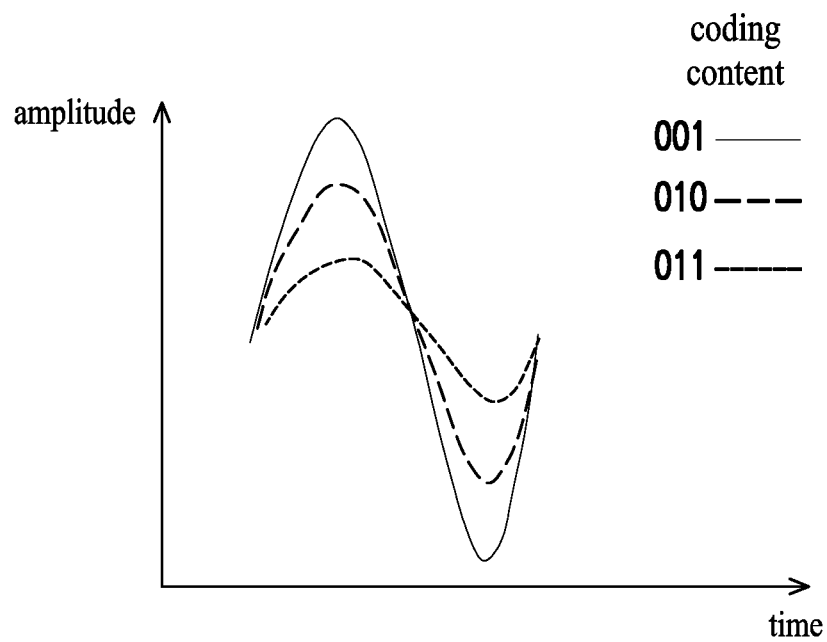
FIG. 4A is a diagram of multiple coding contents and the corresponding waveforms according to an embodiment of the disclosure.

FIG. 4A is a schematic diagram of multiple coding contents and the corresponding waveforms according to an embodiment of the disclosure. Referring to FIG. 4A, it is assumed that the input signals LO+ and LO− are sine wave signals with a frequency $f_{LO}$. The amplitude peak values of the output signal OS corresponding to the coding contents of "001", "010", and "011" are different.

Figure 4B:
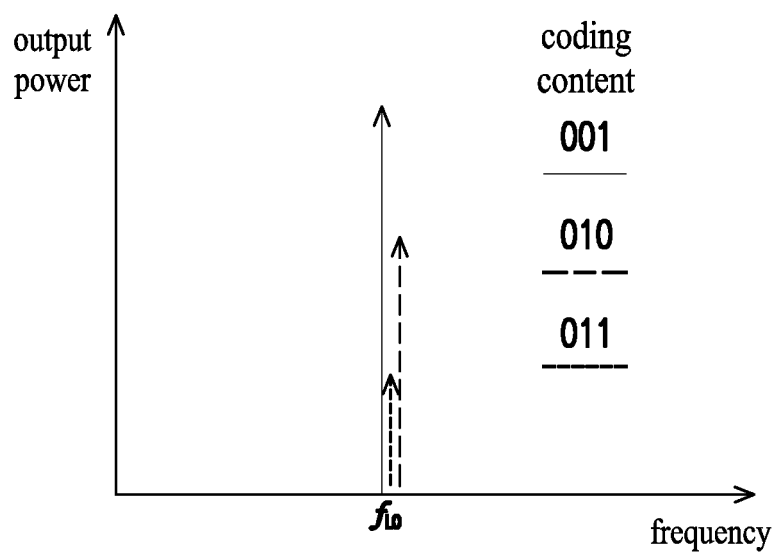
FIG. 4B is a spectrum diagram of multiple coding contents according to an embodiment of the disclosure.

FIG. 4B is a spectrum diagram of multiple coding contents according to an embodiment of the disclosure. Referring to FIG. 4B, the frequencies of the output signal OS corresponding to the coding contents of "001", "010", and "011" are all $f_{LO}$, but the output power in the frequency spectrum is different.

In an embodiment, there is a linear relationship between the amplitude peak value of the output signal OS corresponding to the input digital signal DS having the first coding content and the amplitude peak value of the output signal OS corresponding to the input digital signal DS having the second coding content. Taking Table (2) as an example, the amplitude peak value of the output signal OS corresponding to the coding content of "000" is $4^2$ times the amplitude peak value of the output signal OS corresponding to the coding content of "011". The rest can be inferred in the same way, and the coding contents of "000", "001", "010", "011", "101", "110", and "111" are all integer multiples of $\Delta V_{fLO}$.

In an embodiment, the linear relationship includes a slope corresponding to a step. When the linear relationship is expressed as a linear function, the linear function includes a slope. The step is proportional to an amount of variation between the amplitude peak value of the output signal OS corresponding to the input digital signal DS having the first coding content and the amplitude peak value of the output signal corresponding to the input digital signal having the second coding content, and the step is related to the number of those bits (that is, the number of bits) of the coding content. For example, the step is $\Delta V_{fLO}$, the amplitude peak value of the output signal OS is $V_{fLO}$, and $\Delta V_{fLO} = 2V_{fLO}/(2^N-2)^2$. N is the number of those bits of the coding content, and may also be the bit scale of the digital-to-analog converter 131.

In some embodiments, in addition to the multiplier difference, there may also be a constant difference between the amplitude peak values of the output signals OS in Table (2). Further, the relationship between the amplitudes of the output signals corresponding to different coding contents may not be limited to a linear relationship, and may be other mathematical relationships or unformulated relationships.

In an embodiment, the output power of the output signal OS may be less than or equal to –15 dBm, for example, –40 dBm. However, the output power may be changed according to actual needs.

It is worth noting that the effect of rapidly switching the amplitude of the output signal OS can be achieved through current driving of the digital-to-analog converter 131 and the mixer 132-1.

Figure 5A:
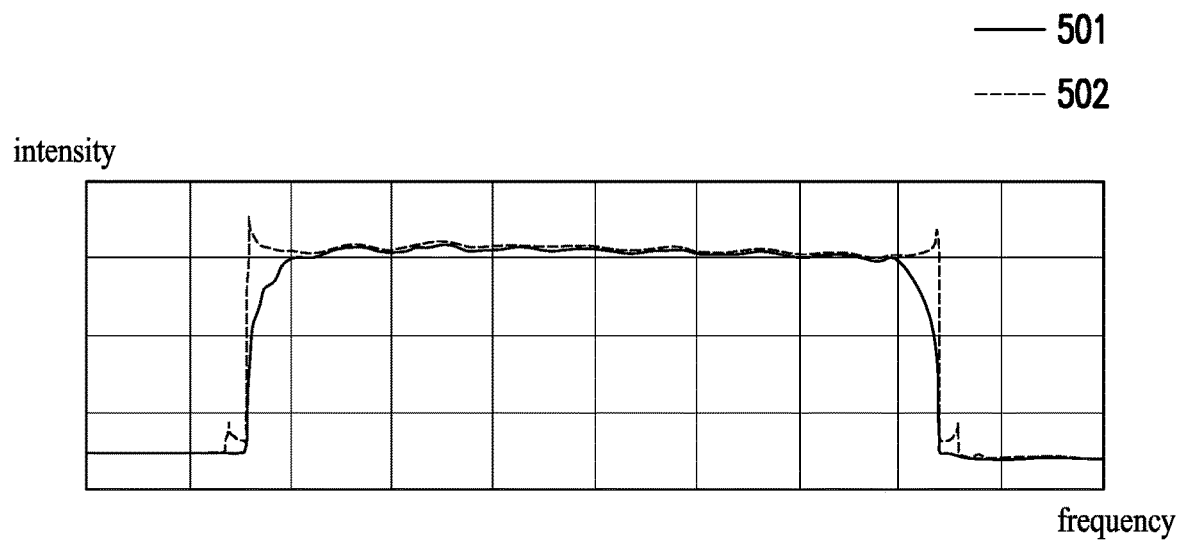
FIG. 5A is a spectrum diagram of actual and expected output signals according to an embodiment of the disclosure.
Figure 5B:
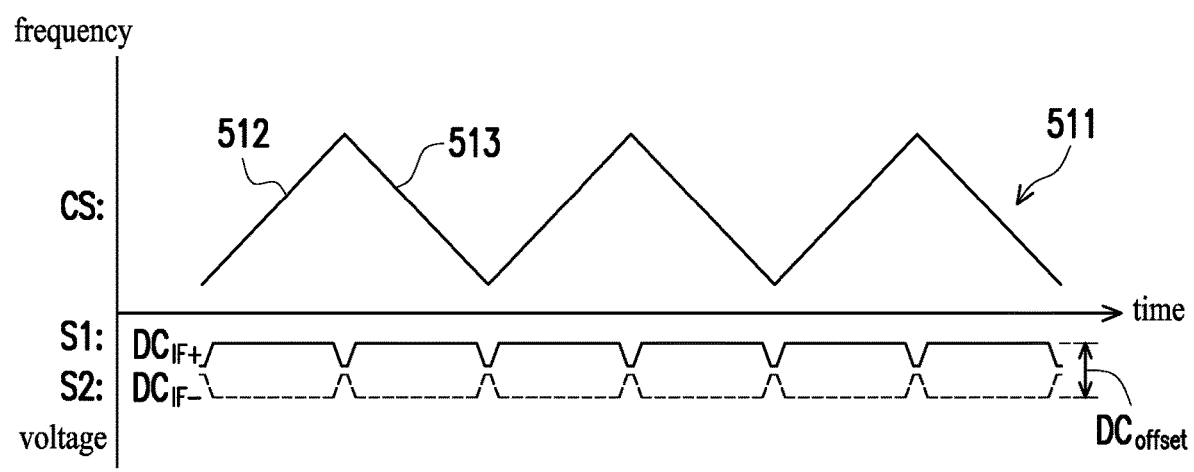
FIG. 5B is a waveform diagram of a carrier signal and two signals according to an embodiment of the disclosure.

In an embodiment, the frequency of the carrier signal CS varies with time during the frequency sweep period. That is, the carrier signal CS is a frequency sweep signal, such as a sawtooth wave, a triangular wave or other chirp/FMCW signals. FIG. 5A is a spectrum diagram of actual and expected output signals OS according to an embodiment of the disclosure, and FIG. 5B is a waveform diagram of the carrier signal CS and the two signals S1 and S2 according to an embodiment of the disclosure. Referring to FIG. 5A, upon comparison between the expected spectrum 501 and the actual spectrum 502, the actual spectrum 502 may have a spike peak with a higher intensity at the edge of the frequency band. The higher-intensity spike peak may require a reduction in transmission power due to the specification of some communication technologies (for example, UWB), which affects the sensing range of the radar.

Referring to FIG. 5B, the spike peak is formed because the waveform of the carrier signal CS includes two segments in the time domain. The frequency in one of the two segments increases/rises with time, as shown in FIG. 5B as the rising segment of the triangular wave 511, that is, the first segment 512. The frequency in the other one of the two segments decreases/falls with time, as shown in FIG. 5B as the falling segment of the triangular wave 511, that is, the second segment 513. A turning segment is formed between the two segments, as shown in FIG. 5B as the turning point between the rising segment and the falling segment of the triangular wave 511, but the turning segment may also appear at a turning point between the falling segment and the rising segment.

The signals S1 and S2 and the carrier signal CS as a frequency sweep signal are input to the mixer 132/132-1. For example, the signal S1 is input to the control port of the transistor T1 in FIG. 3, the signal S2 is input to the control port of the transistor T4, and the carrier signal CS is input to the control ports of the transistors T2, T3, T5, and T6. The amplitude of the output signal OS corresponding to the turning segment is different from the amplitudes of the output signal OS corresponding to the first segment 512 and the second segment 513 (that is, the rising segment and the falling segment). For example, the first output power of the output signal OS corresponding to the turning segment is less than the second output power of the output signal OS corresponding to one (for example, the first segment 512/rising segment) of the two segments, and the first output power of the output signal OS corresponding to the turning segment is less than the third output signal of the output signal OS corresponding to the other one (for example, the second segment 513/falling segment) of the two segments.

In addition, according to Tables (1) and (2), the voltage difference between the signal S1 and the signal S2 can be reflected in the output power of the output signal OS. The amplitudes of the signals S1 and S2 corresponding to the turning segment may also be different from the amplitudes of the signals S1 and S2 corresponding to the falling segment (that is, the second segment 513) and the rising segment (that is, the first segment 512). Taking FIG. 5B as an example, the amplitude $DC_{IF+}$ of the signal S1 corresponding to the falling segment and the rising segment is the highest voltage level, the amplitude $DC_{IF-}$ of the signal S2 corresponding to the falling segment and the rising segment is the lowest voltage level, and the voltage difference $DC_{offset}$ (in absolute value) between the amplitude $DC_{IF+}$ and the amplitude $DC_{IF-}$ is the largest. The voltage difference $DC_{offset}$ (in absolute value) between the amplitude $DC_{IF+}$ of the signal S1 corresponding to the turning segment and the amplitude $DC_{IF-}$ of the signal S2 corresponding to the turning segment is the smallest. That is to say, the voltage difference $DC_{offset}$ between the signals S1 and S2 corresponding to the falling segment or the rising segment is greater than the voltage difference $DC_{offset}$ between the signals S1 and S2 corresponding to the turning segment, or the voltage difference $DC_{offset}$ between the signals S1 and S2 corresponding to the turning segment is less than the voltage difference $DC_{offset}$ between the signals S1 and S2 corresponding to the falling segment or the rising segment. As the voltage difference $DC_{offset}$ decreases, the output power of the output signal OS decreases. Accordingly, through control of the voltage difference $DC_{offset}$ corresponding to different segments in the triangular wave 511 by the above method, the intensity at the edge of the frequency band can be weakened (roll-off), and the frequency spectrum of the output signal OS can be adjusted from the actual spectrum 502 shown in FIG. 5A to approach the expected spectrum 501 shown in FIG. 5A.

In an embodiment, the frequency of the carrier signal CS is fixed. That is, the carrier signal CS is a fixed frequency signal. In this case, the output signal OS is a pulse signal, and the amplitude of the pulse signal corresponds to the coding content of the input digital signal DS. For example, the intensity and/or phase polarity of the amplitude corresponds to the coding content of the input digital signal DS.

Figure 6:
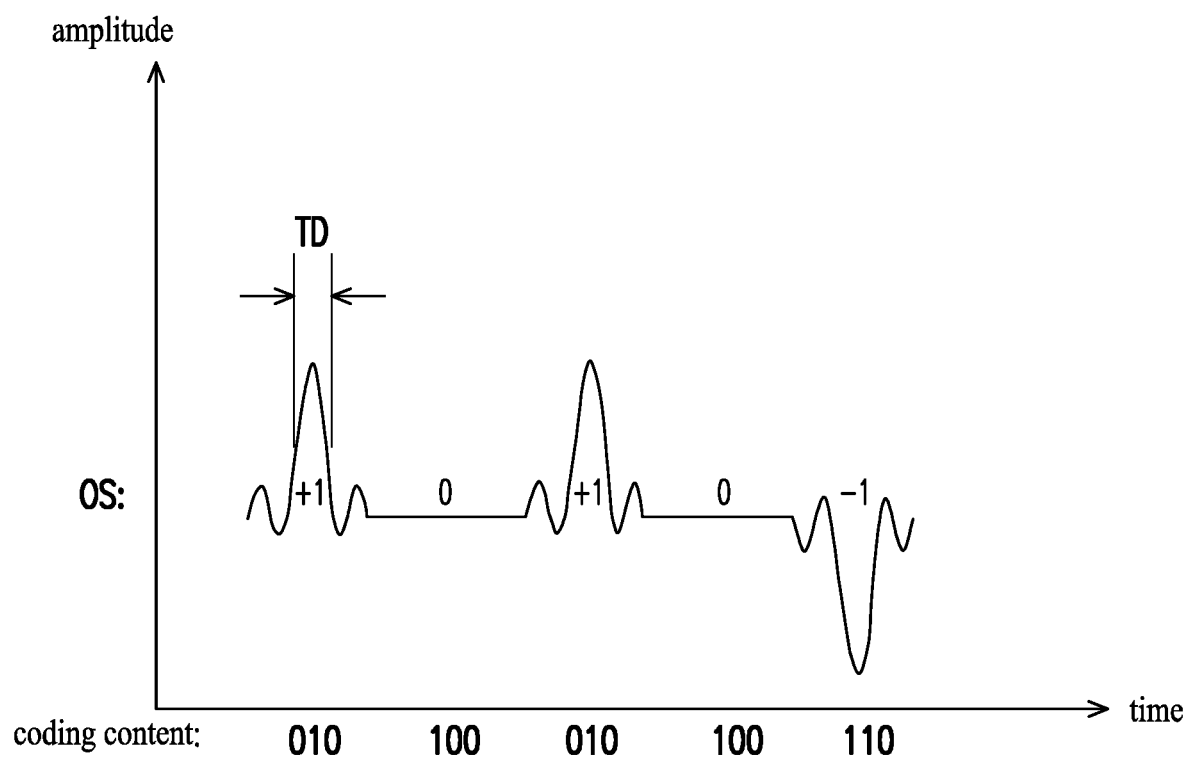
FIG. 6 is a diagram of a coding content and the corresponding pulse signal according to an embodiment of the disclosure.

For example, FIG. 6 is a schematic diagram of a coding content and the corresponding pulse signal according to an embodiment of the disclosure. Referring to FIG. 6, in the time interval TD, a positive short pulse (for example, the coding content in Table (2) is "010", and the corresponding output signal OS is $+2^2\Delta V_{fLO}$) or a negative short pulse (for example, the coding content in Table (2) "110", and the corresponding output signal OS is $-2^2\Delta V_{fLO}$) can be output, and there is no output in the next time interval after the end of the time interval TD (for example, the coding content in Table (2) is "100", and the corresponding output signal OS is 0 or no output). Taking Table (1) as an example, the input digital signal of code "01" may correspond to the positive short pulse, the input digital signal of code "11" may correspond to the negative short pulse, and the input digital signal of code "10" may correspond to no output. Assuming that the value of the time interval TD is less than a certain threshold (for example, less than or about 2 nanoseconds (ns)), then the output signal OS forms a flat spread spectrum signal on the frequency spectrum, and can be used for UWB application and can also be used to determine the distance and position.

In an embodiment, the output signal OS may be an in-phase or out-of-phase signal. The generation of the in-phase signal is, for example, the coding contents of "001", "010", and "011" in Table (2). The generation of the out-of-phase signal is, for example, the coding contents of "101", "110", and "111" in Table (2).

In an embodiment, the output signal OS may be a binary phase shift keying (BPSK) signal. For example, a BPSK pulse/pulse train can be realized by selecting the coding contents of "010" (corresponding to the in-phase signal), "100" (corresponding to no output), and "110" (corresponding to the out-of-phase signal) in Table (2).

Figure 7:
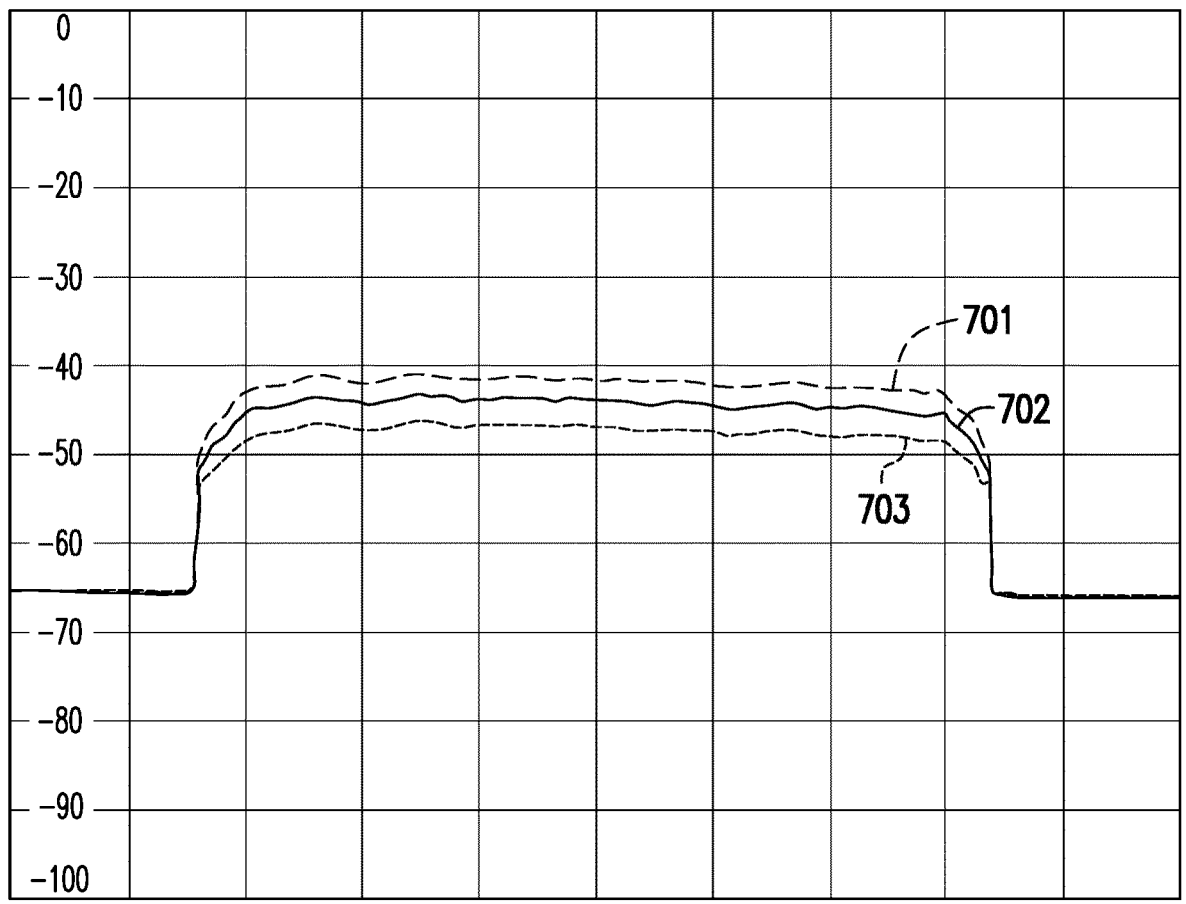
FIG. 7 is a spectrum diagram of power control according to an embodiment of the disclosure.

FIG. 7 is a spectrum diagram of power control according to an embodiment of the disclosure. Referring to FIG. 7, according to design requirements, the controller 19 in FIG. 2B may define the power difference between the maximum output powers of the output signal OS corresponding to different coding contents. For example, the power difference between the maximum values of the output powers 701, 702, and 703 of the output signal OS corresponding to three coding contents is less than 10 dB (decibel), but the disclosure is not limited thereto.

In an embodiment, in the second mode (for example, a mixing mode or other modes for generating new frequencies according to multiple input signals), the signals S1 and S2 are AC intermediate frequency signals. The mixer 132 is also configured to mix the intermediate frequency signal and the carrier signal CS. The intermediate frequency signal is, for example, a sine wave signal or an AC signal of other waveforms. Taking FIG. 3 as an example, the control signals IF+ and IF− are intermediate frequency signals (for example, sine wave signals in AC form), and the input signals LO+ and LO− are carrier signals CS (for example, frequency sweep signals or fixed frequency signals). The mixer 132 mixes the intermediate frequency signal according to the carrier signal CS to generate the output signals RF+ and RF−, and the output signals RF+ and RF− are radio frequency signals.

Figure 8:
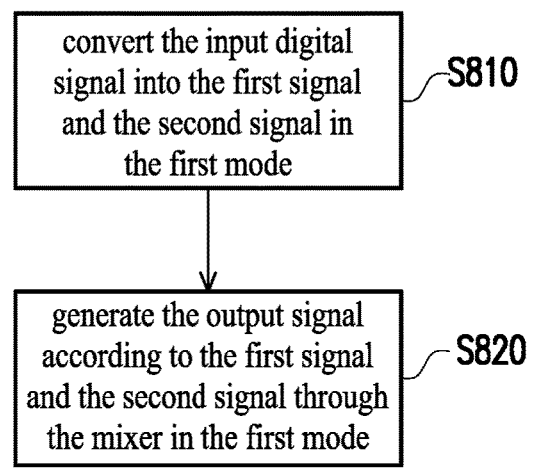
FIG. 8 is a flowchart of a signal control method according to an embodiment of the disclosure.

FIG. 8 is a flowchart of a signal control method according to an embodiment of the disclosure. Referring to FIG. 1 and FIG. 8, in the first mode, the input digital signal DS is converted into two signals S1 and S2, and the coding content of the input digital signal DS includes multiple bits (step S810). In the first mode, the output signal is generated by the mixer 132 according to the two signals S1 and S2 converted from the input digital signal DS (step S820). The output power of the output signal OS corresponding to the input digital signal DS having the first coding content is different from the output power of the output signal OS corresponding to the input digital signal DS having the second coding content. In addition, the intensity of the output signal OS is related to the voltage difference between the two signals S1 and S2 converted from the input digital signal DS.

The details of implementation of each step in FIG. 8 have been described in the foregoing embodiments and examples, and will not be repeated here. In addition to being implemented in the form of circuits, the steps and details of the embodiments of the disclosure can also be implemented by a processor in the form of software, which is not limited by the embodiments of the disclosure.

To sum up, in the signal generation circuit, the radar apparatus, and the signal control method according to the embodiments of the disclosure, the input digital signal having different coding contents is defined, and the corresponding output signal with different output powers is generated through the mixer, thereby achieving multi-level and accurate power control. A pulse train and a spread spectrum signal can be realized by quickly switching signals through the digital-to-analog converter. Further, the voltage difference between the two signals input to the mixer is controlled to apply a lower output power in the turning segment of the carrier signal, thereby preventing the FMCW signal from forming a spike peak at the edge of the frequency band on the frequency spectrum.

In terms of applications, the embodiments of the disclosure can realize a continuous wave (CW), FMCW, pulse type CW or short pulse signal, which can be applied to UWB remote sensing and used for accurate ultra-low power control (for example, less than −15 dBm) for UWB with strict transmission requirements to realize indoor short-range sensors for presence sensing, vital sign monitoring, or liquid level detection, can quickly drop down the FMCW signal at the edge of the frequency band on the frequency spectrum, can achieve BPSK fast encoding capability for pulse trains, and can be applied to other suitable transmission signals.

Although the disclosure has been described above with reference to exemplary embodiments, they are not intended to limit the disclosure. Those skilled in the art may make changes and modifications without departing from the spirit and scope of the disclosure. Therefore, the scope of the disclosure should be defined by the following claims.

What is claimed is:

1. A signal generation circuit, comprising:
a digital-to-analog converter (DAC) configured to convert an input digital signal into a first signal and a second signal in a first mode, wherein a coding content of the input digital signal comprises a plurality of bits;
a mixer coupled to the digital-to-analog converter and configured to respectively input the first signal and the second signal to two input ports of the mixer in the first mode so as to generate an output signal, wherein the output signal has a first output power corresponding to the input digital signal having a first coding content, the output signal has a second output power corresponding to the input digital signal having a second coding content, the second output power is different from the first output power, and an intensity of the output signal is related to a voltage difference between the first signal and the second signal, a waveform of a carrier signal comprises a first segment and a second segment in a time domain, the frequency in the first segment increases with time, and the frequency in the second segment decreases with time, a turning segment is formed between the first segment and the second segment, the first signal, the second signal, and the carrier signal are input to the mixer, and an amplitude of the output signal corresponding to the turning segment is different from amplitudes of the output signal corresponding to the first segment and the second segment.

2. The signal generation circuit according to claim 1, wherein the number of the bits is greater than 2, and the output signal has more than 4 different voltages.

3. The signal generation circuit according to claim 1, wherein there is a linear relationship between an amplitude peak value of the output signal corresponding to the input digital signal having the first coding content and an amplitude peak value of the output signal corresponding to the input digital signal having the second coding content.

4. The signal generation circuit according to claim 3, wherein the linear relationship has a slope corresponding to a step, the step is proportional to an amount of variation between the amplitude peak value of the output signal corresponding to the input digital signal having the first coding content and the amplitude peak value of the output signal corresponding to the input digital signal having the second coding content, and the step is related to the number of the bits.

5. The signal generation circuit according to claim 1, wherein the two input ports are differential input ports.

6. The signal generation circuit according to claim 1, wherein the output signal is a pulse signal, and an amplitude of the pulse signal corresponds to the coding content of the input digital signal.

7. The signal generation circuit according to claim 1, further comprising:

a frequency synthesizer coupled to the mixer and configured to input the carrier signal to the mixer, wherein a frequency of the carrier signal varies with time within a frequency sweep period of the carrier signal.

8. The signal generation circuit according to claim 7, wherein a first voltage difference between the first signal and the second signal corresponding to the turning segment is less than a second voltage difference between the first signal and the second signal corresponding to the first segment or the second segment.

9. The signal generation circuit according to claim 1, wherein the first output power of the output signal is less than or equal to −15 dBm.

10. The signal generation circuit according to claim 1, wherein the mixer is further configured to mix an intermediate frequency signal in a second mode.

11. The signal generation circuit according to claim 1, wherein the mixer is a double-balanced mixer.

12. A radar apparatus, comprising:

the signal generation circuit according to claim 1; and a transmitting circuit coupled to the signal generation circuit and configured to generate a transmission signal according to the output signal, wherein the transmission signal is transmitted out by the radar apparatus.

13. The radar apparatus according to claim 12, wherein the transmitting circuit comprises:

an amplifier coupled to the signal generation circuit and configured to amplify the amplitude of the output signal to generate the transmission signal, wherein the transmission signal is further transmitted through an antenna.

14. A signal control method, comprising:

converting an input digital signal into a first signal and a second signal in a first mode, wherein a coding content of the input digital signal comprises a plurality of bits;

generating an output signal according to the first signal and the second signal through a mixer in the first mode, wherein the output signal has a first output power corresponding to the input digital signal having a first coding content, the output signal has a second output power corresponding to the input digital signal having a second coding content, the second output power is different from the first output power, an intensity of the output signal is related to a voltage difference between the first signal and the second signal, a waveform of a carrier signal comprises a first segment and a second segment in a time domain, the frequency in the first segment increases with time, the frequency in the second segment decreases with time, and a turning segment is formed between the first segment and the second segment; and inputting the first signal, the second signal, and the carrier signal to the mixer, wherein an amplitude of the output signal corresponding to the turning segment is different from amplitudes of the output signal corresponding to the first segment and the second segment.

15. The signal control method according to claim 14, wherein the number of the bits is greater than 2, and the output signal has more than 4 different voltages.

16. The signal control method according to claim 14, wherein there is a linear relationship between an amplitude peak value of the output signal corresponding to the input digital signal having the first coding content and an amplitude peak value of the output signal corresponding to the input digital signal having the second coding content.

17. The signal control method according to claim 16, wherein the linear relationship has a slope corresponding to a step, the step is proportional to an amount of variation between the amplitude peak value of the output signal corresponding to the input digital signal having the first coding content and the amplitude peak value of the output signal corresponding to the input digital signal having the second coding content, and the step is related to the number of the bits.

18. The signal control method according to claim 14, wherein the output signal is a pulse signal, and an amplitude of the pulse signal corresponds to the coding content of the input digital signal.

19. The signal control method according to claim 14, wherein a frequency of the carrier signal varies with time within a frequency sweep period of the carrier signal.

20. The signal control method according to claim 19, further comprising:

setting a first voltage difference between the first signal and the second signal corresponding to the turning segment less than a second voltage difference between the first signal and the second signal corresponding to the first segment or the second segment.

* * * * *